US006566955B1

(12) United States Patent
Tang

(10) Patent No.: US 6,566,955 B1
(45) Date of Patent: May 20, 2003

(54) HIGH BANDWIDTH TRANSRESISTANCE AMPLIFIER

(75) Inventor: Shunbal Tang, Shenzhen (CN)

(73) Assignee: Shenzhen STS Microelectronics Co. Ltd., Shenzhen (CN)

( * ) Notice: Subject to any disclaimer, the term of this patent is extended or adjusted under 35 U.S.C. 154(b) by 0 days.

(21) Appl. No.: 09/644,317

(22) Filed: Aug. 23, 2000

(30) Foreign Application Priority Data

Sep. 2, 1999 (CN) ......................................... 99118482 A

(51) Int. Cl.[7] ................................................. H03F 3/04
(52) U.S. Cl. ....................................... 330/288; 330/257
(58) Field of Search ................................. 330/257, 260, 330/288, 308

(56) References Cited

U.S. PATENT DOCUMENTS

| | | | | |
|---|---|---|---|---|
| 4,333,141 A | * | 6/1982 | Nagano | 330/288 |
| 4,713,628 A | * | 12/1987 | Nelson | 330/252 |
| 5,157,322 A | * | 10/1992 | Llewllyn | 330/257 |
| 5,212,457 A | * | 5/1993 | Frey et al. | 330/288 |
| 5,424,682 A | | 6/1995 | Gomez et al. | 330/254 |
| 5,589,798 A | * | 12/1996 | Harvey | 330/292 |

* cited by examiner

Primary Examiner—Robert Pascal
Assistant Examiner—Khanh Van Nguyen
(74) Attorney, Agent, or Firm—Lisa K. Jorgenson; William J. Kubida

(57) ABSTRACT

An improved transresistance amplifier for generating an output voltage from an input current includes: a current buffer for shifting a dominant pole associated with the input current to a higher frequency, thereby increasing the bandwidth of the transresistance amplifier; a current amplifier for amplifying the buffered input current, thereby generating a high transresistance for the transresistance amplifier; and an I/V amplifier for converting the buffered and amplified input current into the output voltage. The current amplifier includes a current mirror and a current source that draws current from the mirrored side of the current mirror. Also, the current buffer includes a buffering transistor that draws current from the input side of the current mirror, and a differential amplifier having an output that controls the flow of current through the buffering transistor, part of which is drawn by another current source connected to the buffering transistor, and part of which is drawn to make up the input current. The improved transresistance amplifier is particularly useful as part of a pick-up circuit in CD and DVD-ROM applications.

29 Claims, 1 Drawing Sheet

HIGH BANDWIDTH TRANSRESISTANCE AMPLIFIER

TECHNICAL FIELD OF THE INVENTION

This invention relates in general to transresistance amplifiers (also referred to as "I/V amplifiers" or "current-to-voltage amplifiers") and, more specifically, to high bandwidth transresistance amplifiers.

BACKGROUND OF THE INVENTION

As shown in FIG. 1, a conventional transresistance amplifier 10 used, for example, in a CD or DVD-ROM application includes a photo-diode 12 that receives laser light reflected off a CD or DVD-ROM disc. In response to the laser light, the photo-diode 12 generates an input current $I_i$. An operational amplifier 14 and a feedback resistor $R_F$ then convert the input current $I_i$ into a voltage signal represented by an output voltage $V_o$. Specifically, $$V_o \approx I_i \cdot R_F + V_{REF} \tag{1}$$

where $V_{REF}$ is a reference voltage (e.g., ground) at the non-inverting input of the operation amplifier 14, and the gain of the amplifier 14 is assumed to be infinite.

Unfortunately, the photo-diode 12 typically has a relatively large parasitic capacitance $C_p$ (about 2.5 pF) associated with it. As a result, the operational amplifier 14 has a dominant parasitic-capacitance-induced pole at its inverting input, which limits the bandwidth of the transresistance amplifier 10 to about 100 MHz. This limited bandwidth, in turn, tends to distort the voltage signal output from the amplifier 10, which makes the voltage signal harder to read and increases the possibility it will be read incorrectly.

Accordingly, there is a need in the art for an increased bandwidth transresistance amplifier.

SUMMARY OF THE INVENTION

In accordance with this invention, a circuit (e.g., a transresistance amplifier) for generating an output voltage from an input current includes a current amplifier that generates an amplified current in response to a bias current drawn from the current amplifier. Also, a current buffer includes an input node in communication with the input current, a current source that draws current from the input node, a buffering amplifier that has an input connected to the input node and an output that outputs a buffered voltage, and a buffering device for regulating the flow of bias current from the current amplifier to the input node in response to the buffered voltage. Further, an I/V amplifier coupled to the current amplifier receives the amplified current and generates the output voltage in response.

In another embodiment of this invention, an output voltage is generated from an input current when the input current is buffered by varying the output of a differential amplifier in accordance with the input current, and then varying the current flowing through a buffering device in accordance with the varying output of the differential amplifier. Also, the current flowing through the buffering device is amplified, and the output voltage is generated from the amplified current using a transresistance amplifier.

DETAILED DESCRIPTION OF THE ILLUSTRATED EMBODIMENTS

Figure 1:
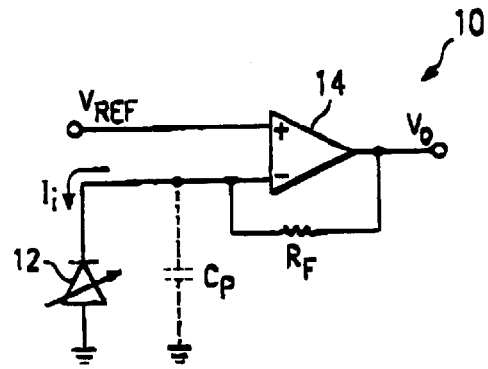
FIG. 1 is a circuit schematic illustrating a conventional transresistance amplifier.
Figure 2:
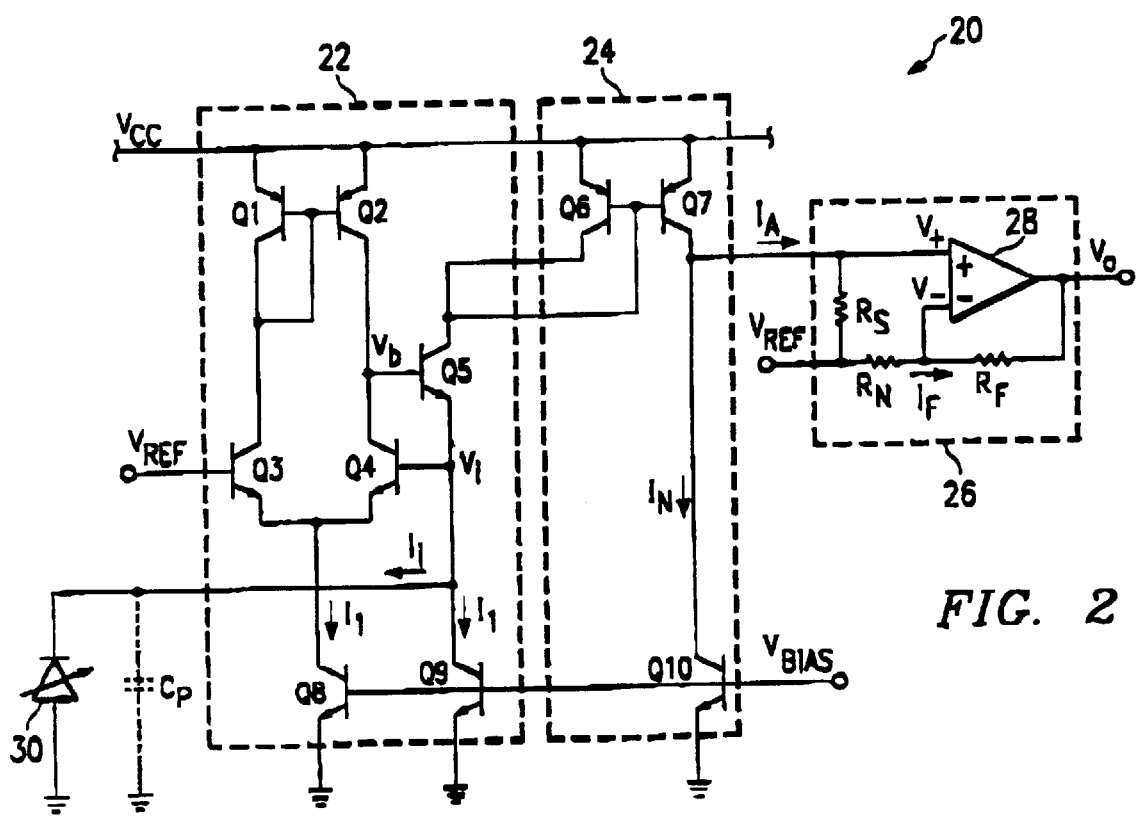
FIG. 2 is a circuit schematic illustrating a transresistance amplifier in accordance with this invention.

As shown in FIG. 2, an improved transresistance amplifier 20 includes a current buffer 22, a current amplifier 24, and an I/V amplifier 26. The current buffer 22 includes: a current mirror made up of a pair of current mirror transistors Q1 and Q2; a pair of differential transistors Q3 and Q4; a pair of biasing transistors Q8 and Q9; and a buffering transistor Q5. The current amplifier 24 includes a current mirror made up of a pair of current mirror transistors Q6 and Q7, and a biasing transistor Q10. The current mirror transistors Q6 and Q7, and the biasing transistors Q9 and Q10, are matched in a 1:N size ratio, with "N" being the current gain of the current amplifier 24. Also, the I/V amplifier 26 includes resistors $R_S$, $R_N$, and $R_F$, and an operational amplifier 28.

Although this invention will be described with reference to an embodiment that includes bipolar transistors, it will be understood by those having skill in the technical field of this invention that other switching technologies are also applicable, including, for example, MOSFET technologies.

In a quiescent state, the photo-diode 30 is off, the biasing transistors Q8 and Q9 each draw a current $I_1$, and the biasing transistor Q10 draws a current $I_N$. The current $I_1$ drawn by the biasing transistor Q9 through the current mirror transistor Q6 and the buffering transistor Q5 causes both an input voltage $V_i$ at the base of the differential transistor Q4 and a buffered voltage $V_b$ at the collector of the differential transistor Q4 to settle to a quiescent level at which the buffering transistor Q5 is sufficiently "on" to support the current $I_1$ flowing through it. At the same time, the current $I_1$ flowing through the current mirror transistor Q6 is mirrored and amplified by the current mirror transistor Q7, which outputs the current $I_N$. Since the biasing transistor Q10 draws all of the current $I_N$ output by the current mirror transistor Q7, little or no amplified current $I_A$ is drawn by the I/V amplifier 26.

In operation, light (e.g., laser light) striking the photo-diode 30 biases the diode 30, causing it to draw an input current $I_i$ and to clamp the input voltage $V_i$ at a diode-drop level. The change in the input voltage $V_i$, and the increased demand for current, cause the buffering transistor Q5 to draw the input current $I_i$, in addition to the current $I_1$, from the current mirror transistor Q6. This, in turn, causes the current mirror transistor Q7 to output an amplified current $I_A$ in addition to the current $I_N$, where $$I_A = I_i \cdot N \tag{2}$$

The output voltage $V_o$ of the I/V amplifier 26 can be determined as follows. Assuming the operational amplifier 28 has infinite gain, then $$V_+ = V_- \tag{3}$$

where $V_+$ and $V_-$ are the voltages at the non-inverting and inverting inputs, respectively, of the operational amplifier 28. It follows, then, that $$Vo = V + -IF \cdot RF \tag{4}$$

where $I_F$ is the feedback current. But $$V+ = VREF + IA \cdot RS \tag{5}$$

and $$I_F=(V_{REF}-V_+)/R_N \quad (6)$$

$$=-I_A \cdot R_S/R_N \quad (7)$$

Accordingly, $$V_o=V_{REF}+(I_A \cdot R_S)+((I_A \cdot R_S \cdot R_F)/R_N) \quad (8)$$

$$=V_{REF}+(I_A \cdot R_S)\cdot(1+R_F/R_N) \quad (9)$$

$$=V_{REF}+(I_i \cdot N \cdot R_S)\cdot(1+R_F/R_N) \quad (10)$$

Since N, $R_S$, $R_F$, and $R_N$ are all constants, the output voltage $V_o$ turns out to be proportional to the input current $I_i$, or $$V_o \approx I_i \cdot C \quad (11)$$

where C is a constant representing $((N \cdot R_S)\cdot(1+R_F/R_N))$.

Because the photo-diode 30 draws the input current $I_i$ from the current amplifier 24 indirectly through the current buffer 22, the current buffer 22 is able to move the dominant pole created by the parasitic capacitance $C_p$ of the diode 30 to a much higher frequency, thereby substantially increasing the bandwidth available to the transresistance amplifier 20. In addition, the current amplifier 24 gives the transresistance amplifier 20 improved transresistance. Certain simulation results, for example, on the transresistance amplifier 20 have shown bandwidths of 116 MHz or more with a transresistance of 180 KΩ or more.

Although this invention has been described with reference to one or more particular embodiments, the invention is not limited to the described embodiments. Rather, the invention is limited only by the appended claims, which include within their scope all equivalent devices and methods that operate according to the principles of the invention as described.

What is claimed is:

1. A circuit for generating an output voltage from an input current, the circuit comprising:
   a current amplifier for generating an amplified current in response to a bias current drawn therefrom;
   a current buffer including:
      an input node in communication with the input current;
      a current source coupled to the input node for drawing current therefrom;
      a differential amplifier having a first differential input coupled to the input node, a second input for receiving a reference voltage and a differential output for outputting a buffered voltage; and
      a switching device coupled to the input node, the output of the differential amplifier, and the current amplifier for regulating the flow of bias current from the current amplifier to the input node in response to the buffered voltage; and
   an I/V amplifier coupled to the current amplifier for receiving the amplified current and generating the output voltage in response thereto.

2. The circuit of claim 1, wherein the current amplifier comprises:
   a current mirror having a bias node for outputting the bias current and a mirrored node for outputting the amplified current; and
   a current source coupled to the mirrored node of the current mirror for drawing current therefrom.

3. The circuit of claim 2, wherein the current mirror includes a pair of current mirror transistors, and the current source includes a current source transistor.

4. The circuit of claim 3, wherein the current mirror transistors and the current source transistor each comprise a bipolar transistor.

5. The circuit of claim 3, wherein the current amplifier has a current gain N, wherein the size ratio of one of the current mirror transistors to the current source transistor and to the other of the current mirror transistors is (1:N).

6. The circuit of claim 1, wherein the current source of the current buffer comprises a biased transistor.

7. The circuit of claim 6, wherein the biased transistor comprises a biased, bipolar transistor.

8. The circuit of claim 6, wherein the current amplifier has a current gain N and comprises:
   a current mirror having a bias node for outputting the bias current and a mirrored node for outputting the amplified current; and
   a current source coupled to the mirrored node of the current mirror for drawing current therefrom;
   wherein the current source includes a current source transistor; and
   wherein the size ratio of the biased transistor to the current source transistor is (1:N).

9. The circuit of claim 1, wherein the differential amplifier has an active load comprising a current mirror.

10. The circuit of claim 1, wherein the switching device comprises a transistor.

11. The circuit of claim 10, wherein the transistor comprises a bipolar transistor.

12. The circuit of claim 1, wherein the I/V amplifier comprises:
   a reference node for receiving a reference voltage;
   an operational amplifier having a non-inverting input for receiving the amplified current, an inverting input, and an output for outputting the output voltage;
   a feedback resistor coupled between the output and the inverting input of the operational amplifier;
   an input resistor coupled between the reference node and the inverting input of the operational amplifier; and
   a bias resistor coupled between the non-inverting input of the operational amplifier and the reference node.

13. A transresistance amplifier for generating an output voltage from an input current, the transresistance amplifier comprising:
   a current amplifier including:
      a diode-connected transistor for outputting a bias current and an output transistor for outputting an amplified current, both connected in a current mirror configuration; and
      a current source transistor coupled to the output transistor for drawing current therefrom;
   a current buffer including:
      an input node in communication with the input current;
      a current source transistor coupled to the input node for drawing current therefrom;
      a differential amplifier having an active load comprising a current mirror, and also having a first differential input coupled to the input node, a second differential input for receiving a reference voltage, and an output for outputting a buffered voltage; and
      a buffering transistor coupled to the input node, the output of the differential amplifier, and the diode-connected transistor of the current amplifier for regulating the flow of bias current from the diode-connected transistor to the input node in response to the buffered voltage; and
   an I/V amplifier comprising:
      a reference node for receiving the reference voltage;
      an operational amplifier having a non-inverting input coupled to the output transistor of the current amplifier for receiving the amplified current, an inverting input, and an output for outputting the output voltage;

a feedback resistor coupled between the output and the inverting input of the operational amplifier;

an input resistor coupled between the reference node and the inverting input of the operational amplifier; and a bias resistor coupled between the non-inverting input of the operational amplifier and the reference node.

14. A method for generating an output voltage from an input current, the method comprising:

buffering the input current by:
varying the output of a differential amplifier in accordance with the input current; and
varying the current flowing through a switching device in accordance with the varying output of the differential amplifier;

amplifying the current flowing through the switching device; and generating the output voltage from the amplified current using a transresistance amplifier.

15. The method of claim 14, wherein the act of varying the output of the differential amplifier in accordance with the input current includes drawing the input current from a node connected to a differential input of the differential amplifier.

16. The method of claim 14, wherein the switching device comprises a bipolar transistor, wherein the act of varying the current flowing through the switching device in accordance with the varying output of the differential amplifier includes applying the varying output of the differential amplifier to the base of the bipolar transistor.

17. The method of claim 14, wherein the act of amplifying the current flowing through the switching device includes:

supplying the current flowing through the switching device from a diode-connected transistor of a current mirror; and generating the amplified current from a non-diode-connected transistor of the current mirror.

18. A method for generating an output voltage from an input current, the method comprising:

buffering the input current by:
varying the output of a differential amplifier in accordance with the input current; and
varying the current flowing through a switching device in accordance with the varying output of the differential amplifier;

amplifying the current flowing through the switching device; and generating the output voltage from the amplified current using a transresistance amplifier, wherein the act of generating the output voltage from the amplified current using the transresistance amplifier includes:
applying the amplified current to the non-inverting input of an operational amplifier;
conducting the amplified current to a reference node through a bias resistor;
applying a reference voltage to the reference node;
connecting the reference node to the inverting input of the operational amplifier through an input resistor;
connecting the inverting input of the operational amplifier to the output of the operational amplifier through a feedback resistor; and
generating the output voltage at the output of the operational amplifier.

19. A circuit for generating an output voltage from an input current, the circuit comprising:

a current amplifier for generating an amplified current in response to a bias current drawn therefrom;

a current buffer including:
an input node in communication with the input current;
a current source coupled to the input node for drawing current therefrom;
a buffering current amplifier having an input coupled to the input node, an output for outputting a buffering current, wherein the output current is proportional to the magnitude of current received at the input node; and
a switching device coupled to the input node, the output of the buffering current amplifier, and the current amplifier for regulating the flow of bias current from the current amplifier to the input node in response to the buffered current; and an I/V amplifier coupled to the current amplifier for receiving the amplified current and generating the output voltage in response thereto.

20. A high bandwidth transresistance amplifier for generating an output voltage from an input current with increased bandwidth, comprising:

a current buffer stage with an input node from which the input current is drawn;

a current amplifier stage coupled to the current buffer stage generating an amplified current based on the input current, wherein the current amplifier stage has greater than unity gain; and a current voltage converter coupled to the current amplifier stage receiving the amplified current and in response, generating the output voltage;

wherein the input node is adapted for coupling with a current source that draws the input current and has parasitic capacitance creating a dominant pole at the input node having a pole frequency and wherein the current buffer includes means for moving the pole frequency to a higher frequency, whereby a bandwidth available to the transresistance amplifier is increased.

21. The transresistance amplifier of claim 20, wherein the higher frequency of the dominant pole is selected such that the available bandwidth is at least about 116 MHz.

22. The transresistance amplifier of claim 20, wherein the means includes:

a differential amplifier having a first differential input coupled to the input node, a second input for receiving a reference voltage, and a differential output for outputting a buffered voltage; and a switching device coupled to the input node, the output of the differential amplifier, and the current amplifier for regulating the flow of a bias current from the current amplifier to the input node in response to the buffered voltage, wherein the amplified current generates the amplified current in response to the bias current drawn therefrom.

23. A method for generating an output voltage from an input current, the method comprising:

buffering the input current by:
varying the output of a differential amplifier is accordance with the input current; and
varying the current flowing through a switching device in accordance with the varying output of the differential amplifier;

amplifying the current flowing through the switching device; and generating the output voltage from the amplified current.

24. The method of claim 23, wherein the input current is provided for the buffering by a photodiode with a parasitic capacitance that creates a dominant pole at a frequency and wherein the buffering is preformed to increase the dominant pole frequency, thereby increasing a bandwidth of the method.

25. The method of claim 24, wherein the method bandwidth is at least about 116 MHz.

26. An enhanced bandwidth circuit for generating an output voltage from an input current from a current source including a photodiode with a dominant parasitic-capacitance-induced pole at a pole frequency, the circuit comprising:

a current amplifier for generating an amplified current in response to a bias current drawn therefrom;

a current buffer including an input node coupled to the current source which draws current therefrom, wherein the current buffer includes means for increasing the pole frequency to provide a circuit bandwidth; and means coupled to the current amplifier for receiving the amplified current and generating the output voltage in response thereto.

27. The circuit of claim 26, wherein the circuit bandwidth is greater than about 100 MHz.

28. The cirucit of claim 26, wherein the circuit has a transresistance greater than about 180 kilo Ohms and the circuit bandwidth is greater than about 116 MHz.

29. The circuit of claim 26, wherein the pole frequency increasing means includes:

a differential amplifier having a first differential input coupled to the input node, a second input for receiving a reference voltage and a differential output for outputting a buffered voltage; and a switching device coupled to the input node, the output of the differential amplifier, and the current amplifier for regulating the flow of bias current from the current amplifier to the input node in response to the buffered voltage.

* * * * *